(12) United States Patent
Chern et al.

(10) Patent No.: US 8,207,775 B2
(45) Date of Patent: Jun. 26, 2012

(54) VOL UP-SHIFTING LEVEL SHIFTERS

(75) Inventors: Chan-Hong Chern, Palo Alto, CA (US);
Fu-Lung Hsueh, Cranbury, NJ (US);
Yuwen Swei, Fremont, CA (US);
Chih-Chang Lin, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 121 days.

(21) Appl. No.: 12/871,343

(22) Filed: Aug. 30, 2010

(65) Prior Publication Data

US 2012/0050930 A1   Mar. 1, 2012

(51) Int. Cl.
*H03L 5/00* (2006.01)
(52) U.S. Cl. ........................................................ 327/333
(58) Field of Classification Search .................. None
See application file for complete search history.

(56) References Cited

U.S. PATENT DOCUMENTS

| | | | |
|---|---|---|---|
| 5,699,001 A * | 12/1997 | Awaji et al. ............... | 327/112 |
| 6,064,230 A * | 5/2000 | Singh .............. | 326/83 |
| 6,157,223 A * | 12/2000 | Blake ............. | 327/108 |
| 6,445,240 B1 * | 9/2002 | Taheri ........... | 327/333 |
| 6,608,515 B2 * | 8/2003 | Taheri ........... | 327/333 |
| 7,414,453 B2 * | 8/2008 | Tachibana et al. ........... | 327/333 |
| 7,986,171 B2 * | 7/2011 | Wang et al. ................ | 327/108 |

* cited by examiner

*Primary Examiner* — Lincoln Donovan
*Assistant Examiner* — Khareem E Almo
(74) *Attorney, Agent, or Firm* — Duane Morris LLP (57) ABSTRACT

A representative level-shifter comprises a dynamically biased current source circuit that receives a first voltage, a first and a second unidirectional current-conducting devices, a first and a second pull-down devices, and a pull-up device. The first and second unidirectional current-conducting devices are coupled to the dynamically biased current source circuit. A voltage output of the level-shifter is located at a first node that is located between the current-constant circuit and the second unidirectional current-conducting device. The first and second pull-down devices are coupled to the first and second unidirectional current-conducting devices, respectively. The pull-up device receives a second voltage and is coupled to the dynamically biased current source circuit and the first unidirectional current-conducting device. The pull-up device is configured to dynamically bias the dynamically biased current source circuit such that a voltage drop of the second unidirectional current-conducting device is output at the voltage output responsive to the pull-up device outputting the second voltage to the dynamically biased current source circuit, the first pull-down device being non-conducting and the second pull-down device being conducting.

20 Claims, 7 Drawing Sheets

VOL UP-SHIFTING LEVEL SHIFTERS

TECHNICAL FIELD

The present invention relates generally to coupling electrical circuits, and more particularly to coupling electrical circuits such as digital logic and/or switching circuits in different power supply domains, using level shifters.

BACKGROUND

A signal in a logic or switching circuit typically assumes one of two voltage levels representing two states or digital values (e.g., one and zero). A level shifter may be coupled between circuits or sections of circuits that operate using different high and low levels, usually determined by the power supply voltages of such circuits or sections. A conventional level shifter typically changes a high-level output voltage (VOH) to a high-level substantially equal to a power supply voltage (Vddhi) of the next successive circuit or section and the low-level output voltage (VOL) remains at ground potential. These level shifters also often suffer Electrical Over Stress (EOS) leading to time dependent device breakdown (TDDB), particularly when implemented in low-voltage core devices.

Some level shifters have been designed to output VOL at a voltage other than ground. One possibility is to provide low output levels VOL at 20% or more of the high level power soppy (Vddhi). These level shifters typically add a bias between the sources of an NMOS pair and ground, to shift the VOL up by using an external bias or an internal bias circuit. Such an external or internal bias circuit provides a constant bias, which can cause an output voltage of the level shifter to be increased. However, due to the bias, the overdrive headroom for the input signals in the low-power-supply side of the level shifter is reduced by the amount of the bias plus a transistor body effect voltage. Consequently, these level shifters fail to function when the sum of the bias and the threshold voltage of the input transistor is close to the low-power-supply voltage. These level shifters also suffer Electrical Over Stress (EOS) issues, particularly when implemented in low-voltage core devices.

An improved level shifter design would be desirable in the art.

SUMMARY

A representative level-shifter comprises a dynamically biased current source circuit that receives a first voltage, first and second unidirectional current-conducting devices, first and second pull-down devices, and a pull-up device providing dynamic biasing. The first and second unidirectional current-conducting devices are coupled to the dynamically biased current source circuit. In this context, a "unidirectional current-conducting" device is considered to be one or more devices arranged to rectify like a diode, although that function might be achieved by a diode or by another element or a combination of elements, such as an FET or other transistor with coupled terminals, for example. A "dynamically biased current source" circuit is considered to be one or more devices arranged to bias an active device and copy a current through the active device by controlling the current in another active device of a circuit, keeping the output current constant regardless of loading, although that function might be achieved by a combination of elements, such as an FET or other transistor with coupled terminals, for example.

A voltage output of the level-shifter is located at a first node that is located between the dynamically biased current source circuit and the second unidirectional current-conducting device. The first and second pull-down devices are coupled to the first and second unidirectional current-conducting devices, respectively. The pull-up device receives a second voltage and is coupled to the dynamically biased current source circuit and the first unidirectional current-conducting device. The pull-up device is configured to dynamically bias the dynamically biased current source circuit such that a voltage drop of the second unidirectional current-conducting device is output at the voltage output of the level-shifter responsive to the pull-up device outputting a biasing voltage (e.g., a second voltage) to the dynamically biased current source circuit, the first pull-down device being non-conducting and the second pull-down device being conducting.

The above and other features of the present invention will be better understood from the following detailed description of certain exemplary embodiments of the invention, explained in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

This description of exemplary embodiments is intended to be read in connection with the accompanying drawings, which are to be considered part of the entire written description. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Exemplary systems are discussed with reference to the figures. Although these systems are described in detail, they are provided for purposes of illustration only and various modifications are feasible within the scope of the subject matter claimed. After the exemplary systems are described, examples of flow diagrams of the systems are provided to explain the manner in which voltage shifting is achieved.

Figure 1:
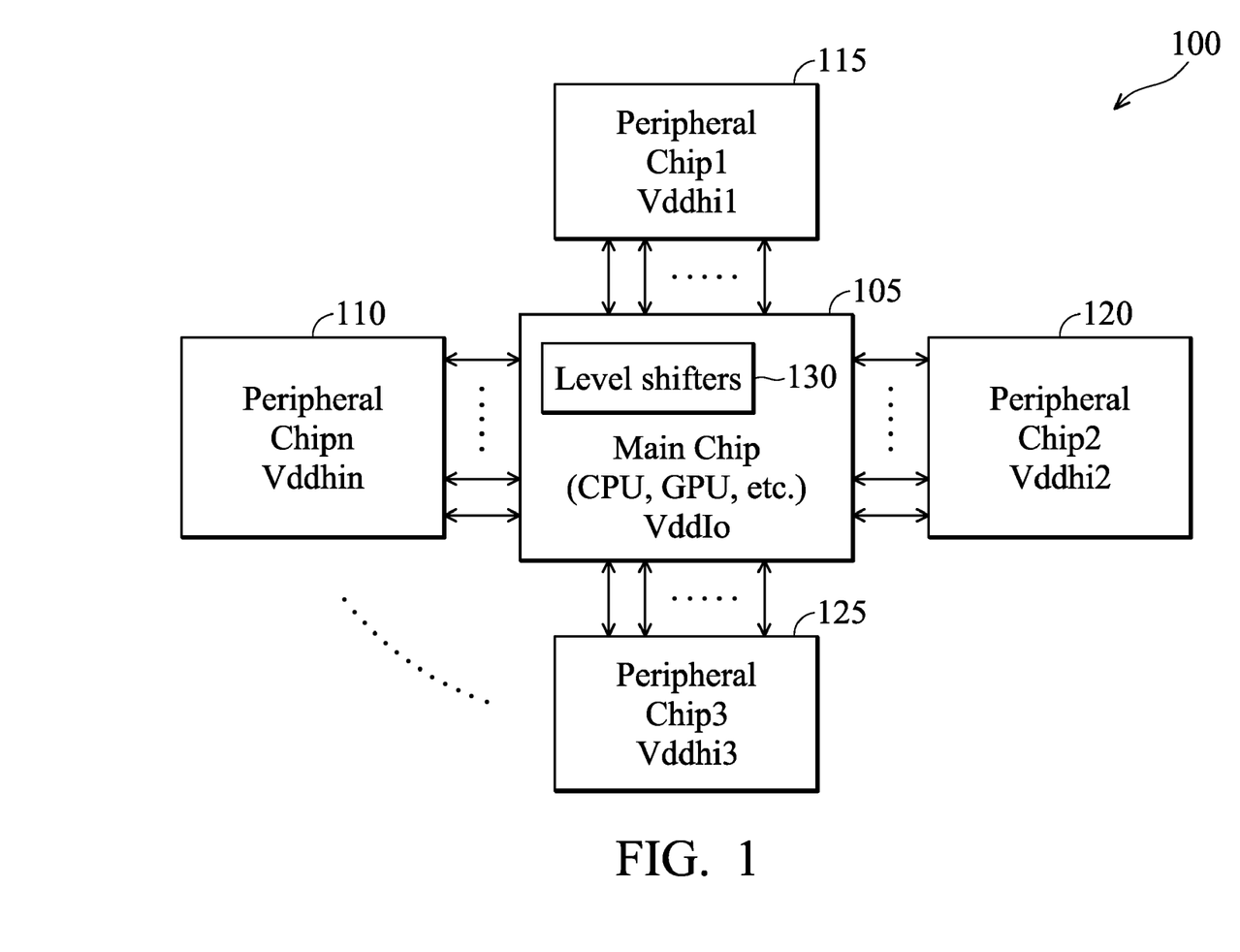
FIG. 1 is a block diagram that illustrates a system having level shifters at a main chip or a core circuit block in accordance with an embodiment of the present disclosure.

FIG. 1 is a block diagram that illustrates an embodiment of a system 100 having level shifters 130 at a main chip or a core circuit block 105. The system 100 includes a main chip or a core circuit block 105, which, for example, can be a central processing unit (CPU), a graphics processing unit (GPU), a system on a chip (SOC), or various other particular elements that are mounted on the same or different chips. Although termed the "main" chip, there is no implication that the main chip has at a particular position in a hierarchy. The main chip or core circuit block 105 and one or more of the peripheral chips or circuit blocks 110, 115, 120, 125 receive and send signals back and forth through appropriate level shifting circuits so that the incoming and outgoing signals are obtained by the respective receiving circuits at voltage levels that render the received signals operational in the receiving circuits. Chip 105 is termed the main chip or core circuit block for purposes of illustration. The main chip or circuit block 105 is electrically coupled to peripheral chips or circuit blocks 110, 115, 120, 125, which can operate at distinct power supply voltages and/or logic reference voltages Vddhi1, Vddhi2, Vddhi3, and Vddhin, respectively. For example, peripheral chipn 110 operates at Vddhin, where "n" refers to a positive integer number.

The main chip or circuit block 105 operates at Vddlo, which is exemplified as a lower voltage than Vddhi1-n operating voltage of the peripheral chips 110, 115, 120, 125. One of the reasons, among others, for the main chip or circuit block 105 to operate at the lower voltage Vddlo may be to enable the main chip or circuit block 105 to dissipate less heat by employing a lower core operating voltage while the peripheral chips 110, 115, 120, 125 operate at higher voltages, Vddhi1, Vddhi2, Vddhi3, and Vddhin. Another reason may be to couple circuits using different operating voltages to couple with legacy devices or circuits, e.g., for forward/backward compatibility. In that case, newer peripheral chips or circuit blocks (not shown) may be included and configured to operate at Vddlo, which the peripheral chips or circuit blocks could be directly coupled to operate with the main chip or circuit block 105, whereas one or more other peripherals 110, 115, 120, 125 use level shifters 130. To operate at two voltage levels—Vddlo and Vddhi, the main chip or circuit block 105 includes one or more level shifters 130, level-shifting from Vddlo at the main chip or circuit block 105 to Vddhi at the peripheral chips or circuit blocks 110, 115, 120, 125. It should be recognized that FIG. 1 shows only certain pairs of chips or circuit blocks with signal couplings and only an exemplary level shifter 130. It is also possible in a given configuration to have other signal couplings and level shifters 130 as appropriate, for example for signals (not shown) that couple between peripheral chips or circuit blocks 110, 115, 120, 125 Vddhin having different logical levels.

To improve the speed and power consumption, the peripheral chips or circuit blocks 110, 115, 120, 125 operate at low-level output voltage (VOL) (e.g., a low logic level voltage greater than twenty percent of voltage Vddhi) and/or at high-level output voltage (VOH) (e.g., a voltage less than eighty percent of Vddhi). The level shifter 130 can provide VOL/VOH to the peripheral chips or circuit blocks 110, 115, 120, 125 using electrical components at the main chip or circuit block 105 and common mode voltage level shifting between the low-voltage power domain and the high voltage power domain (which domains as discussed above can be domains of different chips or other circuit segments such as different parts of a given chip).

The level shifter 130 can provide a desired VOL for up-shifting the signal levels from/to peripheral chips or circuit blocks 110, 115, 120, 125, such as in double data rate (DDR) synchronous dynamic random memory access memory (SDRAM). The level shifter 130 can be implemented according to this disclosure with low-voltage core devices without Electrical Over Stress (EOS) issues. The level shifter 130 can provide a wide range of signal level-shifting for various peripheral chips or circuit blocks 110, 115, 120, 125, such as from 1.0V, 1.5V, 1.8V, 2.5V or 3.3V and still provide VOL and/or VOH at the main chip or circuit block 105 to which the peripherals are coupled through one or more level shifters 130. The level shifter 130 is further described in connection to FIGS. 2-6.

Figure 2:
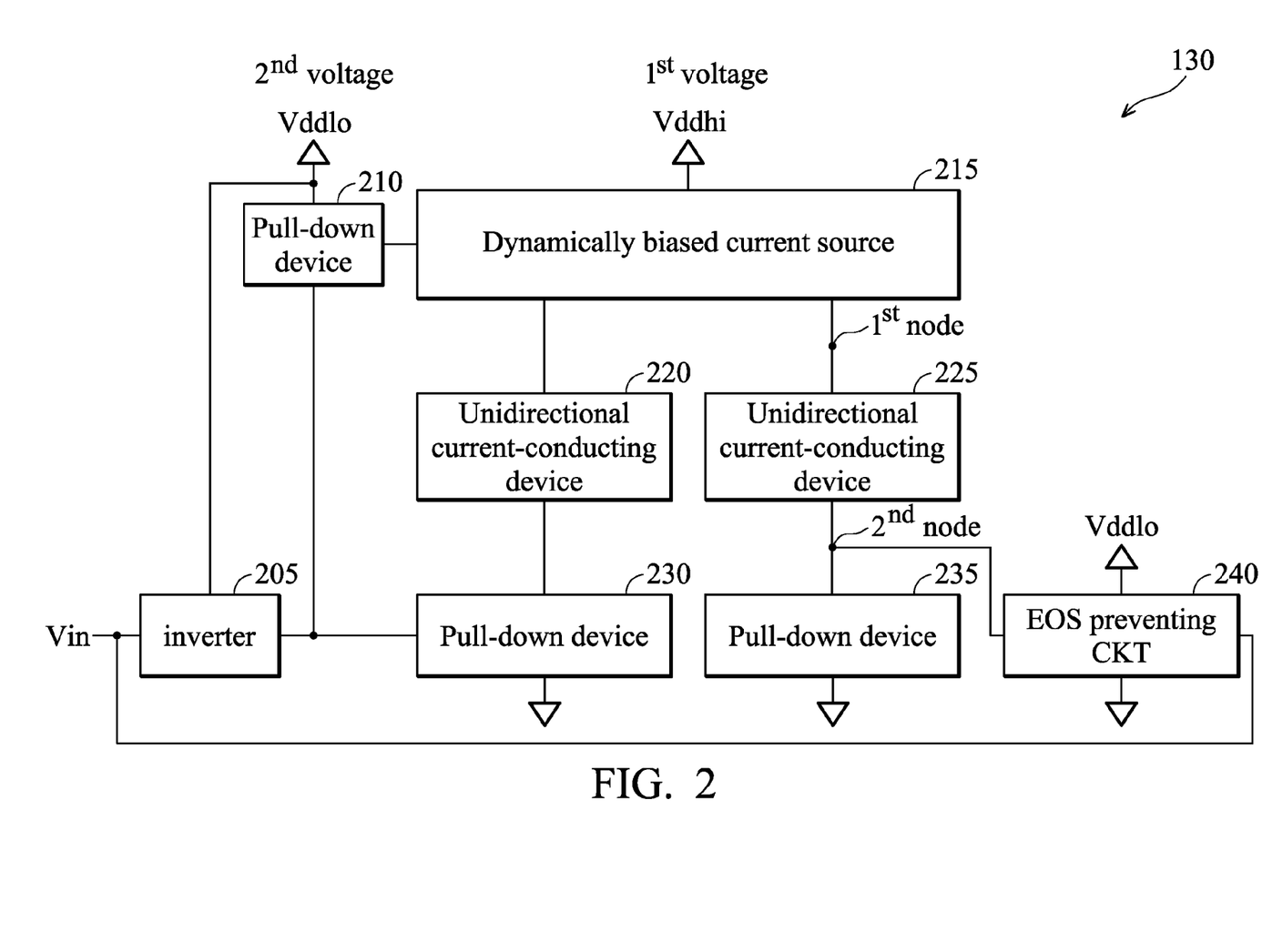
FIG. 2 is a high-level block diagram that illustrates a level shifter in accordance with an embodiment of the present disclosure.

FIG. 2 is a high-level block diagram that illustrates an exemplary embodiment of a level shifter 130, to be coupled between a peripheral 110, 115, 120, 125 and main chip 105 or other circuit segment in the manner such as that shown in FIG. 1. The level-shifter 130 comprises a dynamically biased current source circuit 215 that receives a first voltage (or Vddhi), first and second unidirectional current-conducting devices 220, 225, first and second pull-down devices 230, 235, and a pull-up device 210. The first and second unidirectional current-conducting devices 220, 225 are coupled to the dynamically biased current source circuit 215. A voltage output of the level-shifter 130 is coupled through a first node that is located between the dynamically biased current source circuit 215 and the second unidirectional current-conducting device 225. The first and second pull-down devices 230, 235 are coupled to the first and second unidirectional current-conducting devices 220, 225, respectively.

The pull-up device 210 receives a second voltage (or Vddlo) and is coupled to the dynamically biased current source circuit 215 and the first unidirectional current-conducting device 220. The pull-up device 210 is configured to dynamically bias the dynamically biased current source circuit 215 such that a voltage drop of the second unidirectional current-conducting device 225 is output at the voltage output responsive to the pull-up device 210 outputting the second voltage (or Vddlo) to the dynamically biased current source circuit 215, the first pull-down device 230 being non-conducting and the second pull-down 235 device being conducting.

The level-shifter 130 further includes an electrical-over-stress (EOS) preventive circuit 240 that is coupled between the second unidirectional current-conducting device 225 and the second pull-down device 235. The EOS preventive circuit 240 prevents electrical-over-stress conditions on the second pull-down device 235 as the dynamically biased current source circuit 215 outputs the first voltage at the voltage output. The level-shifter 130 switches the second pull-down device 235 to be non-conducting and biases a second node that is located between the second unidirectional current-conducting device 225 and the second pull-down device 235 to approximately a value of the second voltage or lower than the second voltage, thereby preventing electrical-over-stress conditions on the second pull-down device 235.

The level-shifter 130 further includes an inverter 205 that receives the second voltage and a level shifter input voltage (Vin). The inverter 205 is configured to switch on the pull-up device 210 and to switch off the first pull-down device 230 responsive to receiving a high-level voltage from the level shifter input voltage. Alternatively or additionally, the inverter 205 can be configured to switch off the pull-up device 210 and to switch on the first pull-down device 230 responsive to receiving a low-level voltage from the level shifter input voltage. The inverter 205 and the EOS preventive circuit 240 are further described in connection to FIGS. 3-6.

Figure 3:
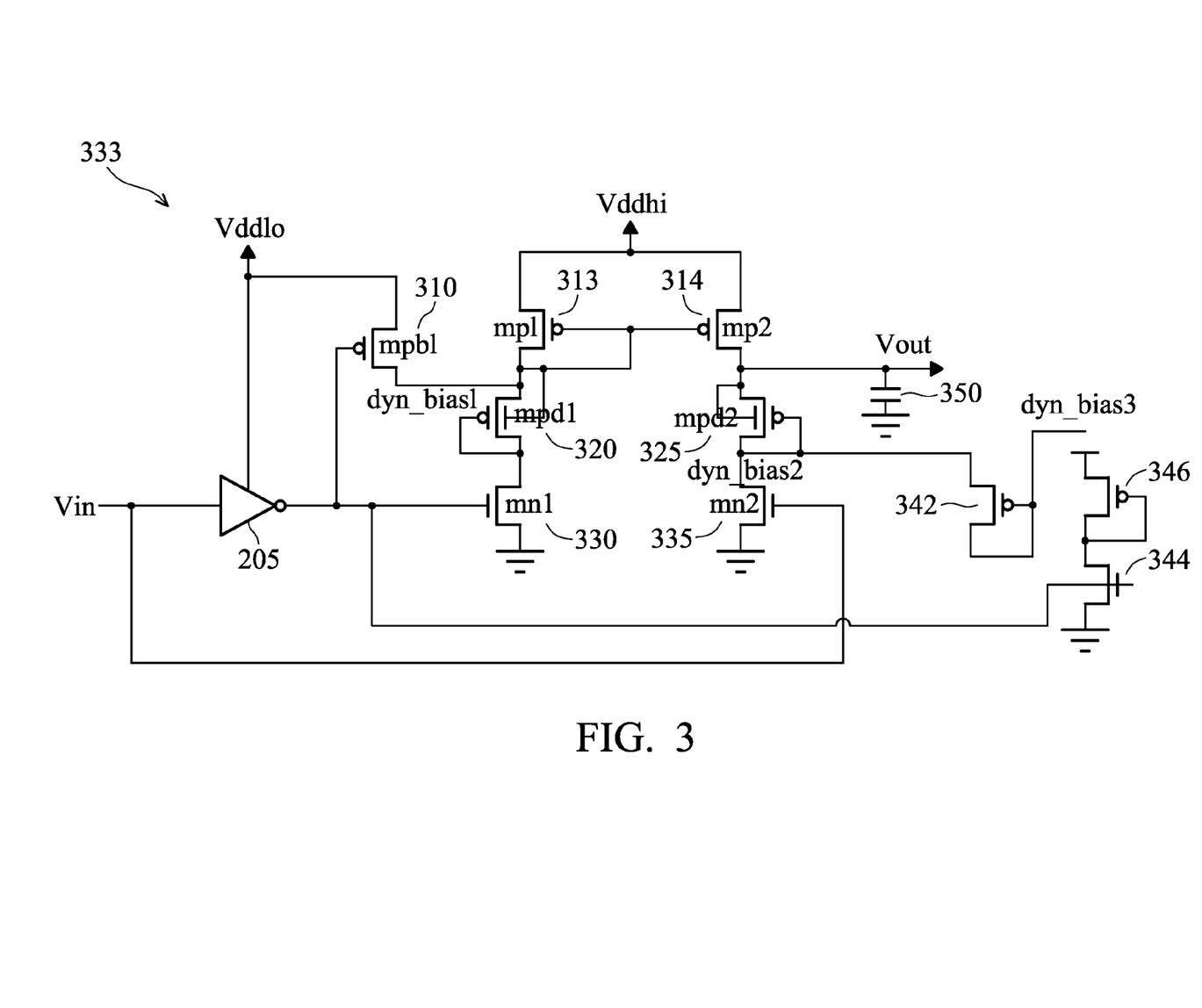
FIG. 3 is a schematic diagram that illustrates a level shifter in accordance with an embodiment of the present disclosure.

FIG. 3 is a schematic diagram that illustrates an embodiment of a level shifter 333, such as that shown in FIG. 2. In this example, the dynamically biased current source circuit 215, first and second unidirectional current-conducting devices 220, 225, first and second pull-down devices 230, 235 of FIG. 2 are implemented with PMOS devices 313, 314, PMOS devices 320, 325, and NMOS devices 330, 335, respectively. The PMOS devices 313, 314 are configured to provide current flowing for the PMOS devices 320, 325 and NMOS devices 330, 335. The drains and gates of the PMOS devices 320, 325 are configured to function as diodes allowing current to flow through them.

The pull-up device 210 of FIG. 2 is implemented with PMOS device 310 in which the source and drain of the PMOS device 310 are connected to Vddlo and a node that is located between the PMOS devices 313, 320. Responsive to the level shifter input voltage (Vin) being at state 1 (or a high signal), the inverter 205 inverts the high signal to a low signal (or state 0) and the PMOS device 310 receives the low signal at its gate, switching the PMOS device 310 on. The NMOS device 330 receives the low signal, switching the NMOS device 330 off, which prevents current from the PMOS device 313 to pass through the diode-connected PMOS 320 and NMOS device 330. The NMOS device 335 receives the high signal, switching the NMOS device 335 on, which allows current from the PMOS device 314 to pass through the diode-connected PMOS device 325 and NMOS device 335. The PMOS device 310 provides Vddlo to the gate of the PMOS device 314, dynamically biasing the PMOS device 314 so that Vout has a value of a diode voltage drop of the gate-to-source (or drain-to-source) of the diode-connected PMOS device 325.

It should be noted that the EOS prevention circuit 240 includes third and fourth unidirectional current-conducting devices 342, 340 and a lower switch 344 coupled together in series, respectively. The third and fourth unidirectional current-conducting devices 342, 340 can be implemented with PMOS devices and the lower switch 344 can be implemented with an NMOS device. The third unidirectional current-conducting device 342 is coupled at the second node located between the PMOS device 325 and the NMOS device 335. Responsive to the level shifter input voltage (Vin) having a high signal (or state 1), the third and fourth unidirectional current-conducting devices 342, 340 and the lower switch 344 are switched off.

Responsive to the level shifter input voltage (Vin) having a low signal (e.g., representing logic state 0), the inverter 205 inverts the low signal to high signal (state 1) and the PMOS device 310 receives the high signal at its gate, switching the PMOS device 310 off. The NMOS device 330 receives the high signal from the inverter 205, switching the NMOS device 330 on, which allows current from the PMOS device 313 to pass through the unidirectional current-conducting diode-connected PMOS device 320 and NMOS device 330. The NMOS device 335 receives the low signal from level shifter input voltage (Vin), switching the NMOS device 335 off, which prevents current from the PMOS device 314 to pass through the NMOS device 335. Thus, the voltage output of the level shifter 333 at the first node has a value of Vddhi.

However, Vddhi can be partially passed to the drain node of the NMOS device 335, which can cause the NMOS device 335 to break down due to electrical-over-stress (EOS). To prevent EOS, the PMOS devices 340, 342 and NMOS device 344 is switched on responsive to receiving the high signal from the inverter 205. The high signal has a value of Vddlo to turn on the NMOS device 344 such that the diode-connected PMOS devices 340, 342 can dynamically bias the drain of the NMOS device 335 to approximately Vddlo to prevent electrical-over-stress issue on the NMOS device 335 in response to the level shifter input voltage being low (e.g., ground). In other words, the PMOS device 342 outputs approximately the value of the Vddlo or lower to the second node of the level shifter 333, preventing EOS on the NMOS device 335.

Figure 4:
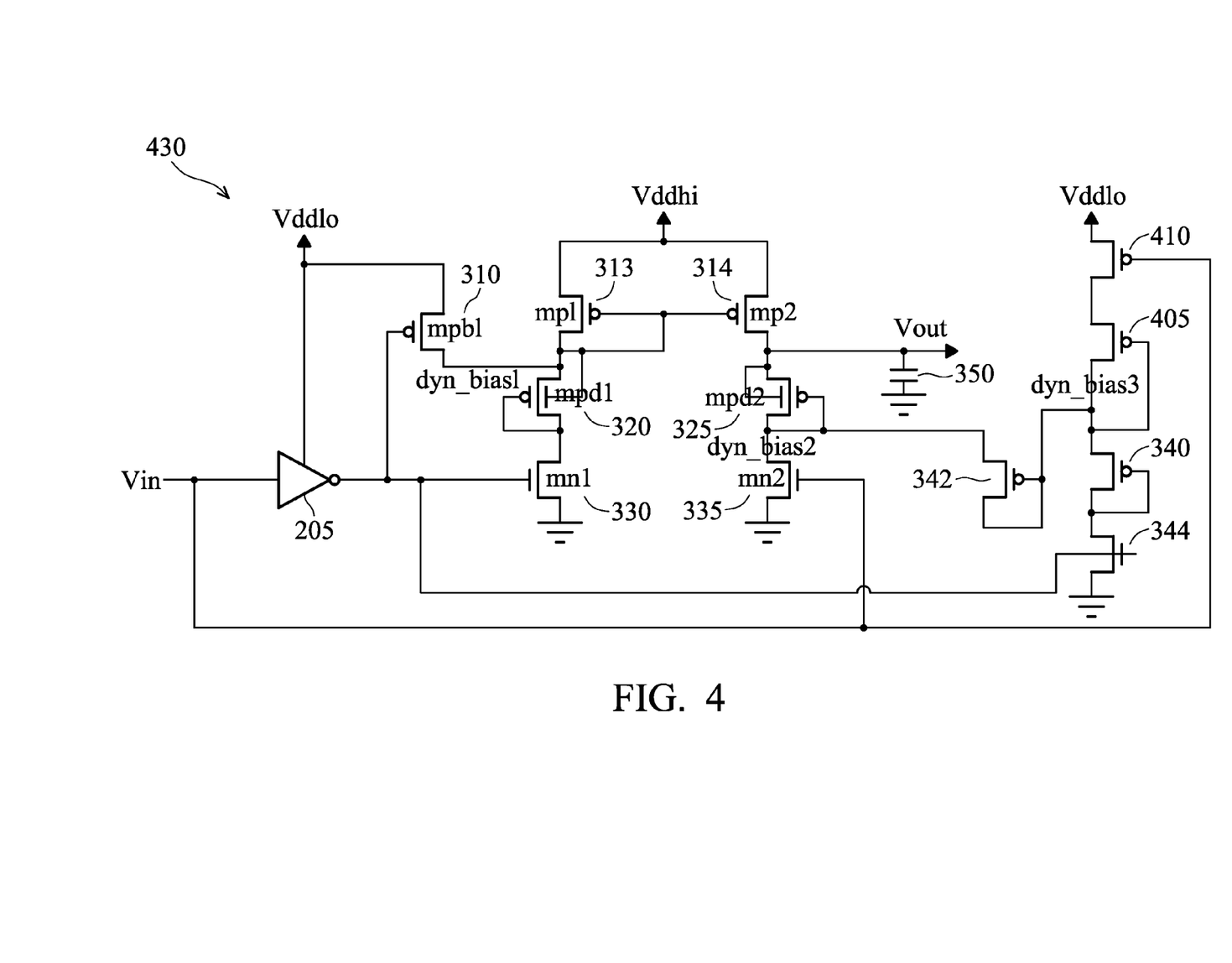
FIG. 4 is a schematic diagram that illustrates a level shifter in accordance with another embodiment.

FIG. 4 is a schematic diagram that illustrates another embodiment of a level shifter 430, such as that shown in FIG. 2. In this example, the architecture of the level shifter 430 of FIG. 4 is similar to the architecture of the level shifter 333 as described in FIG. 3. Like features are labeled with the same reference numbers, such as the inverter 205, PMOS devices 310, 313, 314, 320, 325, 340, 342, and NMOS device 330, 335, 344. However, the EOS preventive circuit 240 further includes an upper switch 410 and a fifth unidirectional current-conducting device 405 that are coupled in series with PMOS device 340 and NMOS device 344, respectively. The upper switch 410 and fifth unidirectional current-conducting device 405 can be implemented with PMOS devices. The PMOS device 410 is electrically coupled to Vddlo and Vin. The PMOS device 342 is now coupled between the PMOS devices 405, 340. Responsive to Vin having a low signal, the PMOS device 410 switches on and passes Vddlo to the PMOS device 405 and a voltage lower than Vddlo to the PMOS device 342, which can output a voltage value lower than Vddlo to the second node responsive to the level shifter input voltage being low (e.g., ground).

Figure 5:
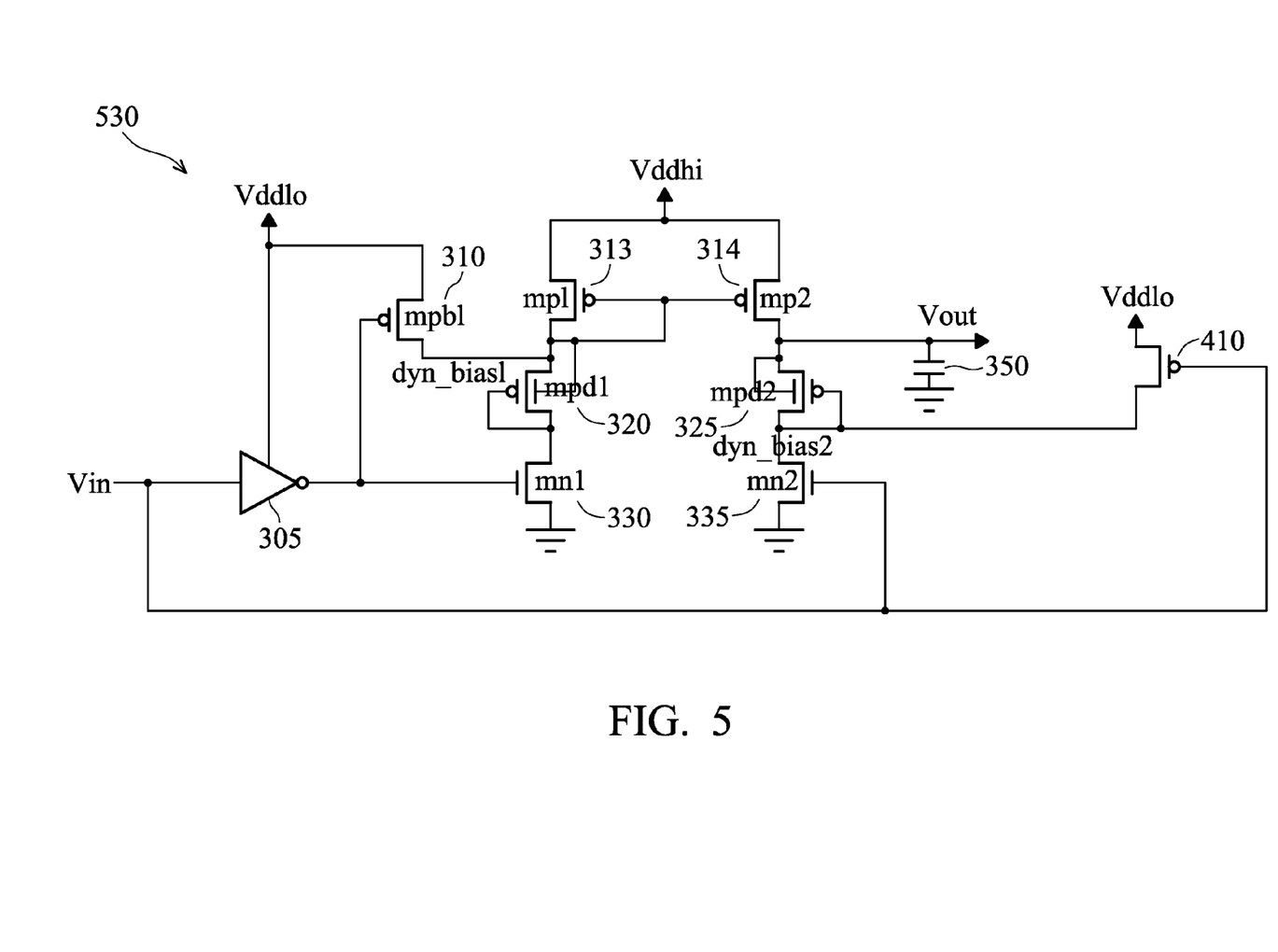
FIG. 5 is a schematic diagram that illustrates a level shifter in accordance with yet another embodiment.

FIG. 5 is a schematic diagram that illustrates another embodiment of a level shifter 530, with certain aspects such as that shown in FIG. 2. In this example, the architecture of the level shifter 530 of FIG. 5 is similar to the architecture of the level shifter 430 as described in FIG. 4. Like features are labeled with the same reference numbers, such as the inverter 205, PMOS devices 310, 313, 314, 320, 325, 410 and NMOS device 330, 335. However, the EOS preventive circuit 240 now does not include PMOS devices 340, 342, 405 and NMOS device 344. The PMOS device 410 is now coupled to the second node and outputs approximately the value of Vddlo to the second node responsive to the level shifter input voltage being low (e.g., ground).

Figure 6:
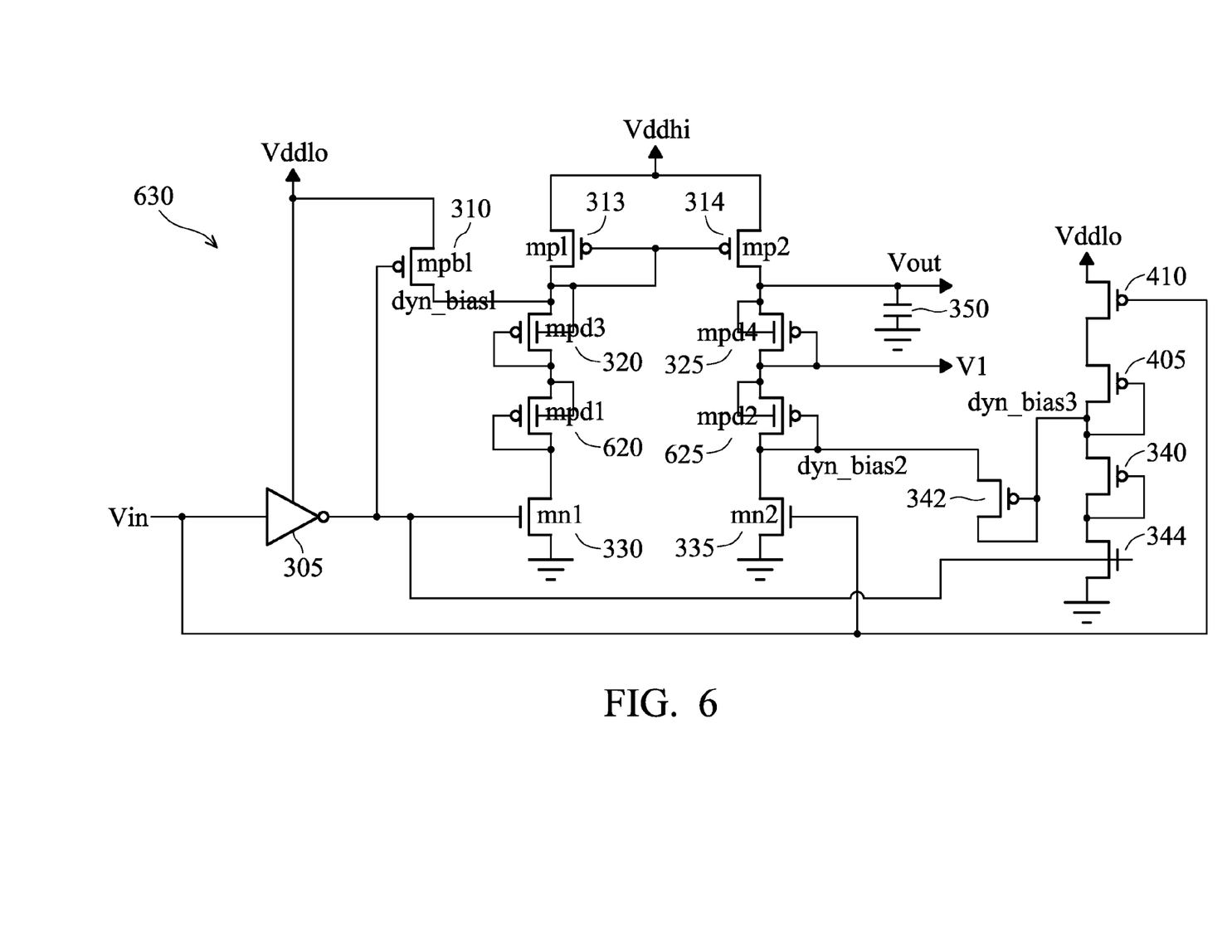
FIG. 6 is a schematic diagram that illustrates a level shifter in accordance with yet another embodiment of the present disclosure; and, FIG. 7 is a flow diagram that illustrates an embodiment of the architecture, functionality, and/or operation of a level shifter in accordance with an embodiment of the present disclosure.

FIG. 6 is a schematic diagram that illustrates yet another embodiment of a level shifter 630, such as that shown in FIG. 2. In this example, the architecture of the level shifter 630 of FIG. 6 is similar to the architecture of the level shifter 430 as described in FIG. 4. Like features are labeled with the same reference numbers, such as the inverter 205, PMOS devices 310, 313, 314, 320, 325, 340, 342, 405, 410 and NMOS device 330, 335, 344. However, the level shifter 630 further includes unidirectional current-conducting devices 620, 625 that are coupled between the PMOS devices 320, 325 and the NMOS devices 330, 335, respectively. The PMOS device 310 is configured to dynamically bias the PMOS devices 313, 314 such that two diode voltage drops of the PMOS devices 325, 625 are output at the voltage output (or first node) for VOL responsive to the PMOS device 310 outputting the second voltage to the PMOS device 314, the NMOS device 330 being non-conducting and the NMOS device 335 being conducting.

Figure 7:
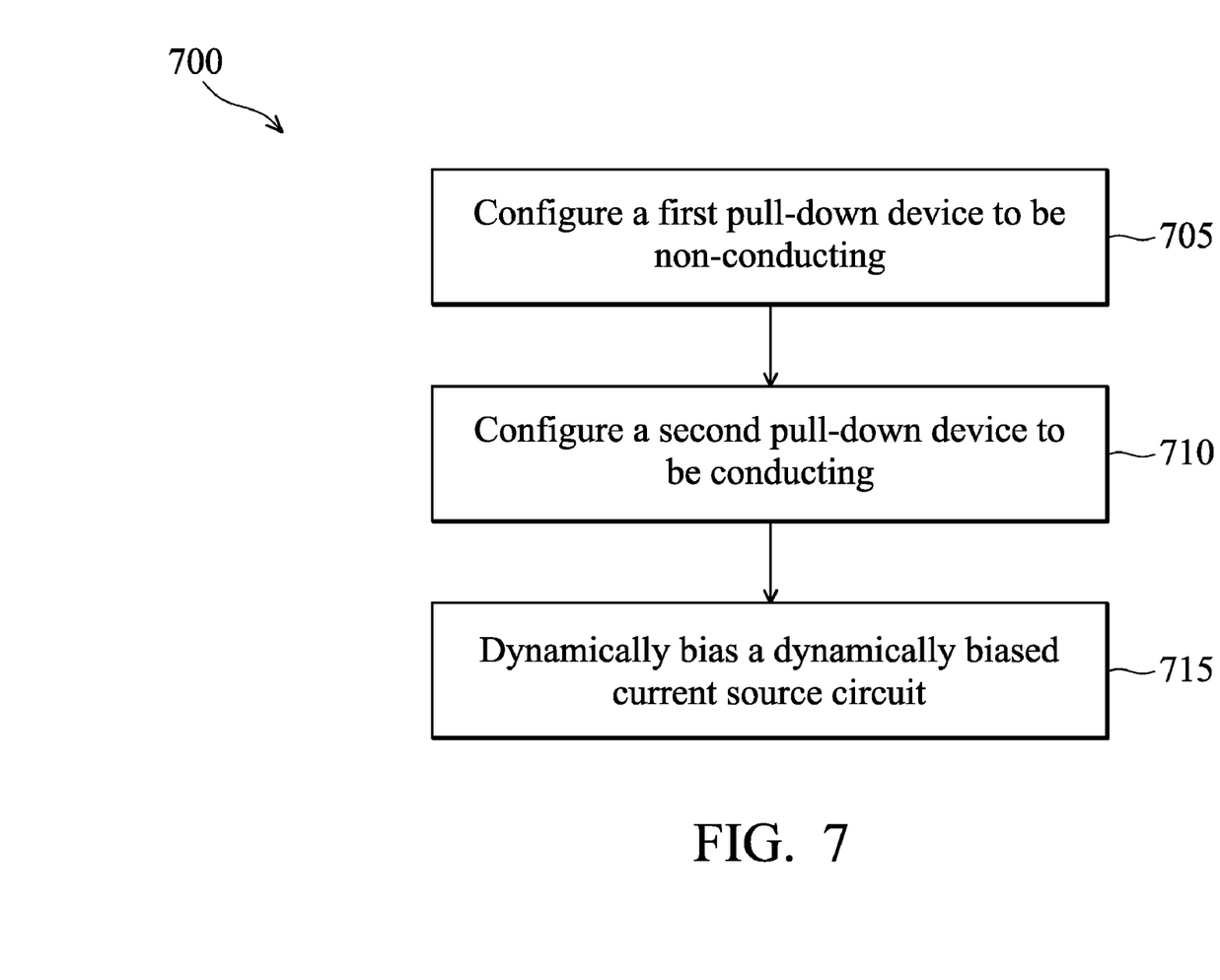

FIG. 7 is a flow diagram 700 that illustrates an embodiment of the architecture, functionality, and/or operation of the level shifter 130, such as that shown in FIG. 1. The flow diagram 700 begins with block 705, which configures a first pull-down device 230 to be non-conducting, which in turn, prevents a first unidirectional current-conducting device 220 from conducting. In block 710, a second pull-down device 235 is configured to be conducting, which in turn, allows a second unidirectional current-conducting device 225 to conduct. In block 715, a dynamically biased current source circuit 215 is dynamically biased such that a voltage drop of the second unidirectional current-conducting device 225 is outputted at a voltage output located at a first node between the dynamically biased current source circuit 215 and the second unidirectional current-conducting device 225.

Responsive to blocks 705, 710, and 715, a first voltage is outputted at the voltage output responsive to the first pull-down device 230 being conducting and the second pull-down device 235 being non-conducting. Alternatively or additionally, a second node that is located between the second unidirectional current-conducting device 225 and the second pull-down device 235 can be biased such that the second node receives approximately a value of a second voltage responsive to the first voltage being outputted at the voltage output and the second pull-down device 235 being non-conducting, preventing electrical-over-stress conditions on the second pull-down device 235.

Alternatively or additionally, the function in block 715 of dynamically biasing the dynamically biased current source circuit 215 can include the function of outputting two diode voltage drops of the second unidirectional current-conducting device 225 and a third unidirectional current-conducting device 625 at the voltage output responsive to the first pull-down device 230 being non-conducting and the second pull-down device 235 being conducting.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A level-shifter comprising:
   a dynamically biased current source circuit that receives a first voltage;
   a first and a second unidirectional current-conducting devices that are coupled to the dynamically biased current source circuit, wherein a voltage output of the level-shifter is located at a first node that is coupled between the dynamically biased current source circuit and the second unidirectional current-conducting device;
   a first and a second pull-down devices that are coupled to the first and second unidirectional current-conducting devices, respectively; and
   a pull-up device that receives a second voltage is coupled to the dynamically biased current source circuit and the first unidirectional current-conducting device, the pull-up device being configured to dynamically bias the dynamically circuit such that a voltage drop of the second unidirectional current-conducting device is output at the voltage output responsive to the pull-up device outputting the second voltage to the dynamically biased current source circuit, the first pull-down device being non-conducting and the second pull-down device being conducting.

2. The level-shifter of claim 1, wherein the first voltage is outputted at the voltage output responsive to the pull-up device being non-conducting, the first pull-down device being conducting and the second pull-down device being non-conducting.

3. The level-shifter of claim 2, further comprising an electrical-over-stress preventive circuit that is coupled between the second unidirectional current-conducting device and the second pull-down device, the electrical-over-stress preventive circuit being configured to bias a second node that is located between the second unidirectional current-conducting device and the second pull-down device such that the second node receives approximately a value of the second voltage or lower responsive to the first voltage being outputted at the voltage output and the second pull-down device being non-conducting, which prevents electrical-over-stress conditions on the second pull-down device.

4. The level-shifter of claim 3, wherein the electrical-over-stress preventive circuit include third and fourth unidirectional current-conducting device and a lower switch coupled together in series, respectively, wherein the third unidirectional current-conducting device is coupled to the second node, wherein the third unidirectional current-conducting device outputs approximately the value of the second voltage or lower to the second node.

5. The level-shifter of claim 3, wherein the electrical-over-stress preventive circuit includes an upper switch, third and fourth unidirectional current-conducting devices, and a lower switch coupled together in series, respectively, wherein the electrical-over-stress preventive circuit further includes a fifth unidirectional current-conducting device coupled between the third and fourth unidirectional current-conducting devices, wherein the fifth unidirectional current-conducting device outputs approximately a voltage value lower than the second voltage to the second node.

6. The level-shifter of claim 3, wherein the electrical-over-stress preventive circuit includes an upper switch, whose input is coupled to a level-shifter input, the upper switch outputs approximately the value of the second voltage to the second node.

7. The level-shifter of claim 1, further comprising sixth and seventh unidirectional current-conducting devices that are coupled between the first and second unidirectional current-conducting devices and the first and second pull-down devices, respectively.

8. The level-shifter of claim 7, wherein the pull-up device is configured to dynamically bias the dynamically biased current source circuit such that two diode voltage drops of the second unidirectional current-conducting device and the seventh unidirectional current-conducting device are outputted at the voltage output responsive to the pull-up device outputting the second voltage to the dynamically biased current source circuit, the first pull-down device being non-conducting and the second pull-down device being conducting.

9. The level-shifter of claim 1, further comprising and a level-shifter voltage input and an inverter that receives the second voltage, the inverter being configured to switch on the pull-up device and to switch off the first pull-down device responsive to receiving a high-level voltage from the level-shifter voltage input.

10. The level-shifter of claim 1, further comprising a level-shifter voltage input and an inverter that receives the second voltage, the inverter being configured to switch off the pull-up device and to switch on the first pull-down device responsive to receiving a low-level voltage from the level-shifter voltage input.

11. A level-shifter comprising:
    a dynamically biased current source circuit that receives a first voltage;
    a first and a second unidirectional current-conducting devices that are coupled to the dynamically biased current source circuit, wherein a level-shifter output of the level-shifter is located at a first node that is located between the dynamically biased current source circuit and the second unidirectional current-conducting device;

a first and a second pull-down devices that are coupled to the first and second unidirectional current-conducting devices, respectively; and a pull-up device that receives a second voltage is coupled to the dynamically biased current source circuit and the first unidirectional current-conducting device, wherein the first voltage is outputted at the level-shifter output responsive to the pull-up device being non-conducting, the first pull-down device being conducting and the second pull-down device being non-conducting.

12. The level-shifter of claim 11, further comprising an electrical-over-stress preventive circuit that receives the second voltage and is coupled between the second unidirectional current-conducting device and the second pull-down device, the electrical-over-stress preventive circuit being configured to bias a second node that is located between the second unidirectional current-conducting device and the second pull-down device such that the second node receives approximately a value of the second voltage responsive to the first voltage being outputted at the level-shifter output and the second pull-down device being non-conducting, which prevents electrical-over-stress conditions on the second pull-down device.

13. The level-shifter of claim 12, wherein the electrical-over-stress preventive circuit includes an upper switch, third and fourth unidirectional current-conducting devices, and a lower switch coupled together in series, respectively, wherein the electrical-over-stress preventive circuit further includes a fifth unidirectional current-conducting device coupled between the third and fourth unidirectional current-conducting devices, wherein the fifth unidirectional current-conducting device outputs approximately the value of the second voltage to the second pull-down device.

14. The level-shifter of claim 11, wherein the pull-up device is configured to dynamically bias the current-constant circuit such that a voltage drop of the second unidirectional current-conducting device is outputted at the level-shifter output responsive to the pull-up device outputting the second voltage to the current-constant circuit, the first pull-down device being non-conducting and the second pull-down device being conducting.

15. The level-shifter of claim 11, further comprising sixth and seventh unidirectional current-conducting devices that are coupled between the first and second unidirectional current-conducting devices and the first and second pull-down devices, respectively.

16. The level-shifter of claim 15, wherein the pull-up device is configured to dynamically bias the current-constant circuit such that two diode voltage drops of the second unidirectional current-conducting device and the seventh unidirectional current-conducting device are outputted at the level-shifter output responsive to the pull-up device outputting the second voltage to the dynamically biased current source circuit, the first pull-down device being non-conducting and the second pull-down device being conducting.

17. A method of voltage shifting comprising:
configuring a first pull-down device to be non-conducting, which in turn, prevents a first unidirectional current-conducting device from conducting;
configuring a second pull-down device to be conducting, which in turn, allows a second unidirectional current-conducting device to conduct; and
dynamically biasing a dynamically biased current source circuit such that a voltage drop of the second unidirectional current-conducting device is outputted at a voltage output located at a first node between the dynamically biased current source circuit and the second unidirectional current-conducting device.

18. The method of claim 17, further comprising outputting a first voltage at the voltage output responsive to the first pull-down device being conducting and the second pull-down device being non-conducting.

19. The method of claim 17, further comprising biasing a second node that is located between the second unidirectional current-conducting device and the second pull-down device such that the second node receives approximately a value of a second voltage responsive to the first voltage being outputted at the voltage output and the second pull-down device being non-conducting, which prevents electrical-over-stress conditions on the second pull-down device.

20. The method of claim 17, wherein the step of dynamically biasing the dynamically biased current source circuit includes the step of outputting two diode voltage drops of the second unidirectional current-conducting device and a third unidirectional current-conducting device at the voltage output responsive to the first pull-down device being non-conducting and the second pull-down device being conducting.

* * * * *